(12) United States Patent
Shimizu (10) Patent No.: US 10,109,785 B2
(45) Date of Patent: Oct. 23, 2018

(54) METHOD FOR MANUFACTURING ACOUSTIC WAVE DEVICE

(71) Applicant: TAIYO YUDEN CO., LTD., Tokyo (JP)

(72) Inventor: Yohei Shimizu, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 641 days.

(21) Appl. No.: 14/681,729

(22) Filed: Apr. 8, 2015

(65) Prior Publication Data

US 2015/0325775 A1 Nov. 12, 2015

(30) Foreign Application Priority Data

May 12, 2014 (JP) ................................ 2014-098665

(51) Int. Cl.
| | | |
|---|---|---|
| *H01L 41/338* | (2013.01) | |
| *H01L 41/047* | (2006.01) | |
| *H03H 3/08* | (2006.01) | |
| *H03H 9/10* | (2006.01) | |
| *H03H 9/72* | (2006.01) | |

(52) U.S. Cl.
CPC ........ *H01L 41/338* (2013.01); *H01L 41/0471* (2013.01); *H03H 3/08* (2013.01); *H03H 9/1064* (2013.01); *H03H 9/1092* (2013.01); *H03H 9/72* (2013.01); *Y10T 29/42* (2015.01); *Y10T 29/43* (2015.01); *Y10T 29/49005* (2015.01)

(58) Field of Classification Search
CPC ..... H01L 41/0471; H01L 41/338; H03H 3/08; H03H 9/1064; H03H 9/1092; H03H 9/72; Y10T 29/42; Y10T 29/43; Y10T 29/49005
See application file for complete search history.

(56) References Cited

U.S. PATENT DOCUMENTS

| | | | |
|---|---|---|---|
| 7,968,432 B2 | 6/2011 | Tamura et al. | |
| 2002/0057141 A1* | 5/2002 | Nishizawa | ............... H03H 9/72 333/193 |
| 2011/0312193 A1 | 12/2011 | Abe | |

(Continued)

FOREIGN PATENT DOCUMENTS

| | | |
|---|---|---|
| JP | 2002-192371 A | 7/2002 |
| JP | 2011040999 A * | 2/2011 |

(Continued)

OTHER PUBLICATIONS

Japanese Office Action dated Jan. 9, 2018, in a counterpart Japanese patent application No. 2014-098665. (A machine translation (not reviewed for accuracy) attached.).

*Primary Examiner* — A. Dexter Tugbang
(74) *Attorney, Agent, or Firm* — Chen Yoshimura LLP (57) ABSTRACT

A method for manufacturing an acoustic wave device includes: forming reforming regions in a substrate along a first direction and a second direction intersecting the first direction by irradiating the substrate with a laser beam under different conditions in the first direction and the second direction, the substrate including a piezoelectric substrate on which an IDT (InterDigital Transducer) is formed, and linear expansion coefficients of the piezoelectric substrate being different in the first direction and the second direction; and cutting the substrate in the first direction and the second direction at the reforming regions.

10 Claims, 7 Drawing Sheets

(56) References Cited

U.S. PATENT DOCUMENTS

| | | |
|---|---|---|
| 2012/0248939 A1 | 10/2012 | Funabiki |
| 2013/0167340 A1 | 7/2013 | Nishidate |
| 2014/0020822 A1 | 1/2014 | Shimizu |
| 2014/0159544 A1* | 6/2014 | Abe .................... H03H 9/1092 310/313 B |

FOREIGN PATENT DOCUMENTS

| | | |
|---|---|---|
| JP | 2012-000636 A | 1/2012 |
| JP | 2012-209617 A | 10/2012 |
| JP | 2013-138362 A | 7/2013 |
| JP | 2014-22966 A | 2/2014 |
| WO | 2012/029735 A1 | 3/2012 |

\* cited by examiner

FIRST DIRECTION

SECOND DIRECTION

FIRST DIRECTION

SECOND DIRECTION

METHOD FOR MANUFACTURING ACOUSTIC WAVE DEVICE

CROSS-REFERENCE TO RELATED APPLICATION

This application is based upon and claims the benefit of priority of the prior Japanese Patent Application No. 2014-098665, filed on May 12, 2014, the entire contents of which are incorporated herein by reference.

FIELD

A certain aspect of the present invention relates to an acoustic wave device and a method for manufacturing the same.

BACKGROUND

It is known to use a laser beam for cutting an acoustic wave device. For example, there is known a method for cutting a bonded substrate in which a base substrate and a lid substrate are bonded. In the method, a nick is formed by irradiating the lid substrate with a laser beam, and then the bonded substrate is pushed from a base substrate side, thereby cutting the bonded substrate (e.g. Japanese Patent Application Publication No. 2012-209617). For example, there is known a method for cutting a bonded substrate in which a supporting substrate and a piezoelectric substrate are bonded. In the method, a reforming region is formed by irradiating the supporting substrate with a laser beam, and then the bonded substrate is cut at the reforming region (e.g. Japanese Patent Application Publication No. 2014-22966).

As described in Japanese Patent Application Publication No. 2014-22966, the reforming region is formed by irradiating the supporting substrate with the laser beam, and then the bonded substrate is cut at the reforming region. Thereby, it is possible to suppress the occurrence of chipping and cracks. However, there is still room for improvement in the cutting method of the bonded substrate.

SUMMARY OF THE INVENTION

According to a first aspect of the present invention, there is provided a method for manufacturing an acoustic wave device including: forming reforming regions in a substrate along a first direction and a second direction intersecting the first direction by irradiating the substrate with a laser beam under different conditions in the first direction and the second direction, the substrate including a piezoelectric substrate on which an IDT (InterDigital Transducer) is formed, and linear expansion coefficients of the piezoelectric substrate being different in the first direction and the second direction; and cutting the substrate in the first direction and the second direction at the reforming regions.

According to a second aspect of the present invention, there is provided an acoustic wave device, including: a substrate including a piezoelectric substrate on which an IDT (InterDigital Transducer) is formed, linear expansion coefficients of the piezoelectric substrate being different in a first direction and a second direction intersecting the first direction; and reforming regions formed by irradiating side surfaces of the substrate along the first direction and the second direction with a laser beam, the reforming regions including a first reforming region to be formed along the first direction and a second reforming region to be formed along the second direction, the first reforming region and the second reforming region being located at different heights in a thickness direction of the substrate.

DETAILED DESCRIPTION

Hereinafter, a description will be given of an embodiment of the present invention with reference to the drawings.

First Embodiment

Figure 1A:
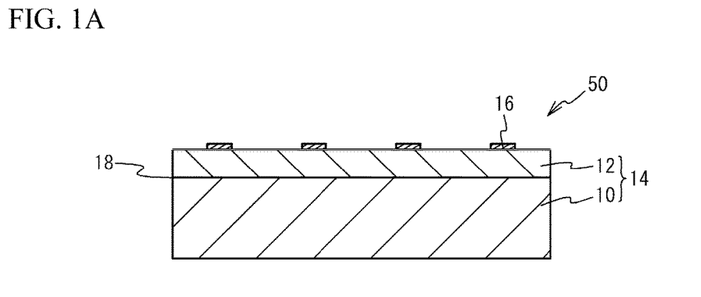
FIGS. 1A to 1C are cross-sectional views illustrating a method for manufacturing an acoustic wave device according to a first embodiment (part 1)

FIGS. 1A to 2B are cross-sectional views illustrating a method for manufacturing an acoustic wave device according to a first embodiment. As illustrated in FIG. 1A, a wafer 50 is prepared, and the wafer 50 includes: a bonded substrate 14 in which a lower surface of a piezoelectric substrate 12 is bonded on an upper surface of a supporting substrate 10; and IDTs (Interdigital Transducer) 16 formed on the piezoelectric substrate 12. In the bonded substrate 14, atoms constituting the supporting substrate 10 and atoms constituting the piezoelectric substrate 12 form an amorphous layer at a boundary between the supporting substrate 10 and the piezoelectric substrate 12, so that the supporting substrate 10 and the piezoelectric substrate 12 are bonded firmly. The supporting substrate 10 is an insulated substrate such as a sapphire substrate, for example. The piezoelectric substrate 12 is a rotated Y-axis cut X-direction propagation lithium tantalate (LT) substrate, for example. It is desirable that the piezoelectric substrate is a rotated Y-axis cut X-direction propagation LT substrate having a Y-axis cut angle from 36 degrees or more to 48 degrees or less from a viewpoint of performance of the acoustic wave device. Each of the IDTs 16 is a metal film such as aluminum (Al), for example. The thickness of the supporting substrate 10 is 100 to 300 μm, for example. The thickness of the piezoelectric substrate 12 is 20 to 100 μm, for example.

Figure 1B:
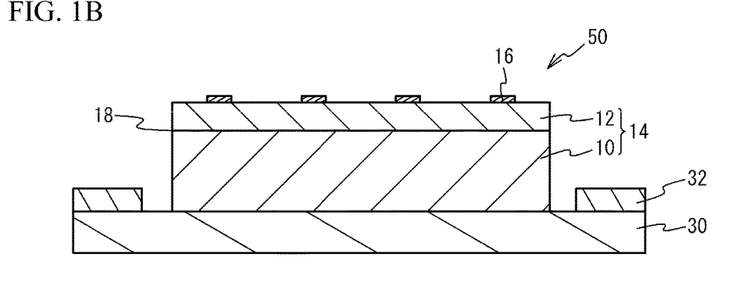

As illustrated in FIG. 1B, a lower surface of the wafer 50 is stuck on a dicing tape 30. The dicing tape 30 is fixed to a dicing ring 32.

Figure 1C:
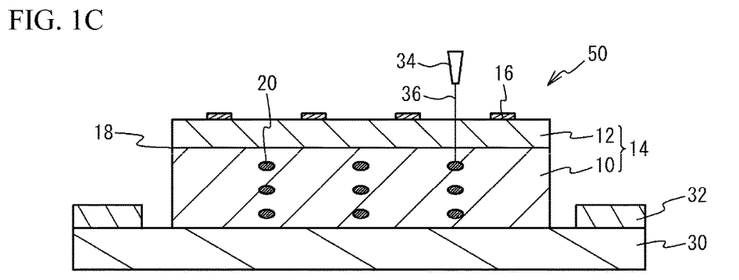

As illustrated in FIG. 1C, a laser irradiation apparatus 34 irradiates the supporting substrate 10 with a laser beam 36 through the piezoelectric substrate 12. Reforming regions 20 in which the material of the supporting substrate 10 is reformed are formed in the supporting substrate 10 by heat of the laser beam 36. One or more reforming regions 20 are formed in a thickness direction of the supporting substrate 10. The reforming regions 20 may be formed in the piezoelectric substrate 12. The reforming regions 20 are formed in a cutting region (a scribe line) for cutting the wafer 50. The cutting region is formed in a first direction and a second direction that is a direction intersecting with the first direction (e.g. a direction perpendicular to the first direction) when the wafer 50 is viewed from the above. In the first embodiment, it is assumed that the first direction is an X-axis direction of a crystal orientation of the piezoelectric substrate 12 made of the rotated Y-axis cut X-direction propagation LT substrate, and the second direction is the direction intersecting with the X-axis direction (e.g. the direction perpendicular to the X-axis direction). Therefore, in the first direction and the second direction, linear expansion coefficients of the piezoelectric substrate 12 are different. The linear expansion coefficient of the piezoelectric substrate 12 in the first direction is larger than the linear expansion coefficient of the piezoelectric substrate 12 in the second direction.

The laser beam 36 is a green laser beam, for example, and a second harmonic of a Nd:YAG laser, for example. By using a laser beam having a wavelength of about 500 nm, the reforming regions 20 can be efficiently formed in the supporting substrate 10. Here, the wavelength of the laser beam 36 can be appropriately set depending on the materials of the supporting substrate 10 and the piezoelectric substrate 12.

Figure 3A:
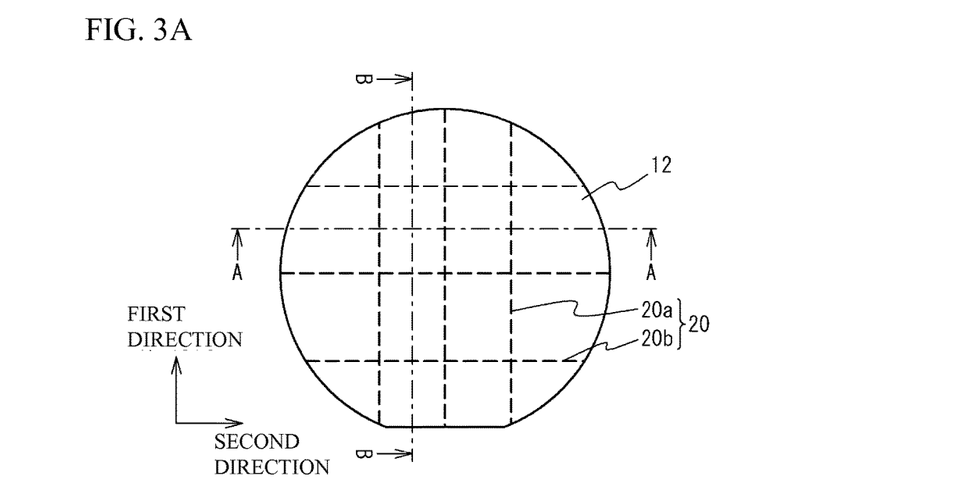
FIG. 3A is a top view of a wafer right after a reforming region is formed in the first embodiment.
Figure 3B:
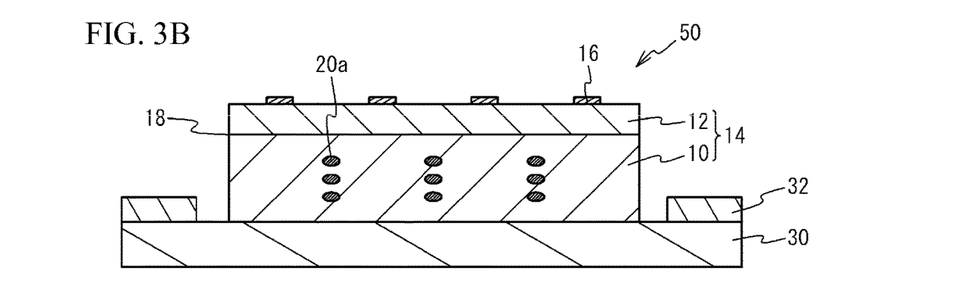
FIG. 3B is a cross-sectional view of the wafer taken along a line A-A in FIG. 3A.
Figure 3C:
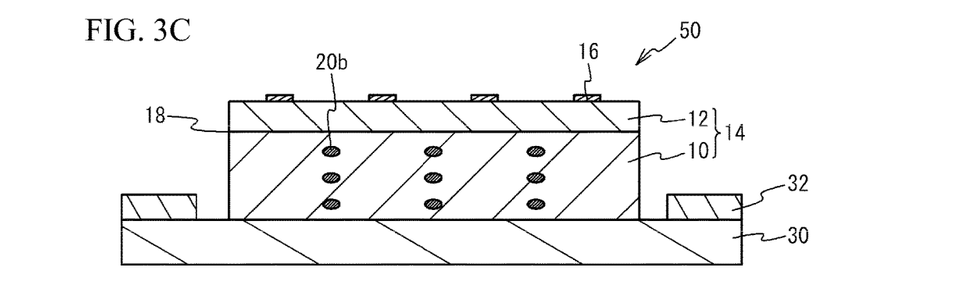
FIG. 3C is a cross-sectional view of the wafer taken along a line B-B in FIG. 3A.

Here, a description will be given of the reforming region using FIGS. 3A to 3C. FIG. 3A is a top view of the wafer right after the reforming region is formed in the first embodiment. FIG. 3B is a cross-sectional view of the wafer taken along a line A-A in FIG. 3A. FIG. 3C is a cross-sectional view of the wafer taken along a line B-B in FIG. 3A. Here, in FIG. 3A, the illustration of the IDTs 16 is omitted for the simplification of the drawing. When the reforming regions 20 are formed by irradiating the bonded substrate 14 with the laser beam 36 along each of the first direction and the second direction as illustrated in FIGS. 3A to 3C, the laser beam 36 is emitted by making the conditions of the first direction and the second direction different. For example, the laser beam 36 is emitted by making at least one of an output power of the laser beam, a focal position, a moving velocity and an irradiation frequency different in the first direction and the second direction. The size of the reforming region changes by the output power, a formation position of the reforming region in a height direction changes by the focal position, and an interval between adjacent reforming regions changes by the moving velocity and/or the irradiation frequency.

By irradiating the bonded substrate 14 with the laser beam 36 under different conditions in the first direction and the second direction, reforming regions 20a to be formed along the first direction and reforming regions 20b to be formed along the second direction are formed at different heights in a thickness direction of the bonded substrate 14, for example. The reforming regions 20a to be formed along the first direction are formed away from an upper surface and a lower surface of the bonded substrate 14, compared with the reforming regions 20b to be formed along the second direction, for example. For example, an interval between the reforming regions 20b located at both ends in the thickness direction of the bonded substrate 14 is formed wider than an interval between the reforming regions 20a located at both ends in the thickness direction of the bonded substrate 14.

Figure 2A:
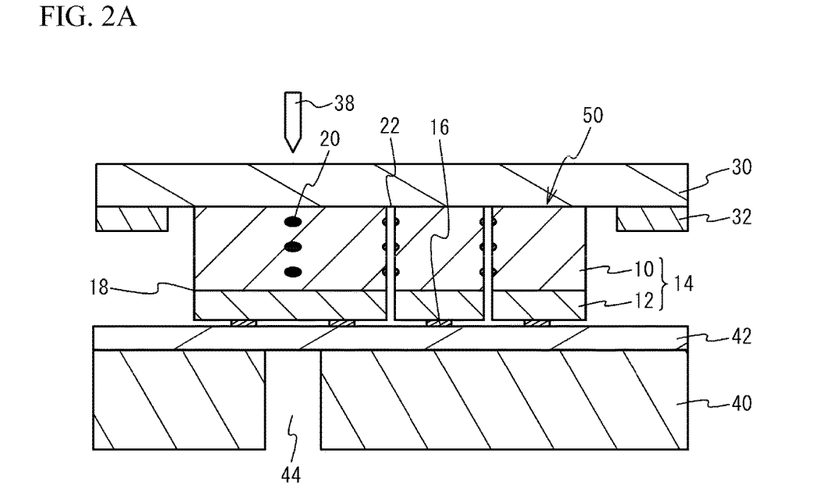
FIGS. 2A and 2B are cross-sectional views illustrating the acoustic wave device according to the first embodiment (part 2)

As illustrated in FIG. 2A, the wafer 50 is reversed upside down. The wafer 50 is arranged on a supporting stage 40 via a protection sheet 42. A surface of the wafer 50 near the piezoelectric substrate 12 is protected with the protection sheet 42. A groove 44 is provided in the supporting stage 40 under the reforming regions 20. A blade 38 is pressed to the wafer 50 from above the dicing tape 30, cut surfaces 22 are formed in regions of the bonded substrate 14 overlapping the reforming regions 20, and hence the wafer 50 is broken in the first and the second directions. For example, the wafer 50 is broken in the second direction so as to be a plurality of strip-shaped wafers, and then the strip-shaped wafers are broken in the first direction and divided. Here, the location of the groove 44 is linked with the location of the blade 38.

Figure 2B:
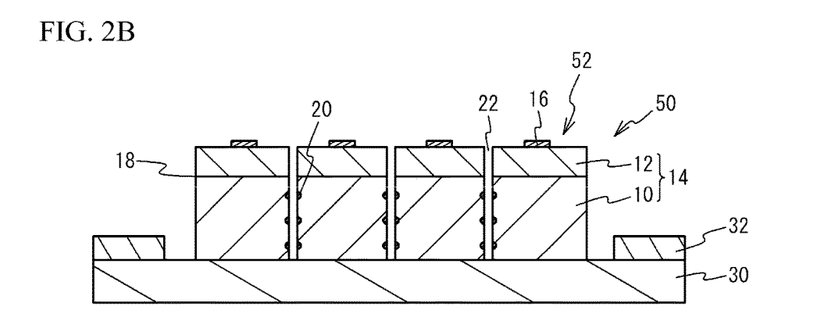

As illustrated in FIG. 2B, the wafer 50 is separated from the supporting stage 40. The wafer 50 is reversed upside down. The cut surfaces 22 are formed in the wafer 50, and the wafer 50 are divided as a plurality of chips 52. The chips 52 are picked up from the dicing tape 30.

Figure 4A:
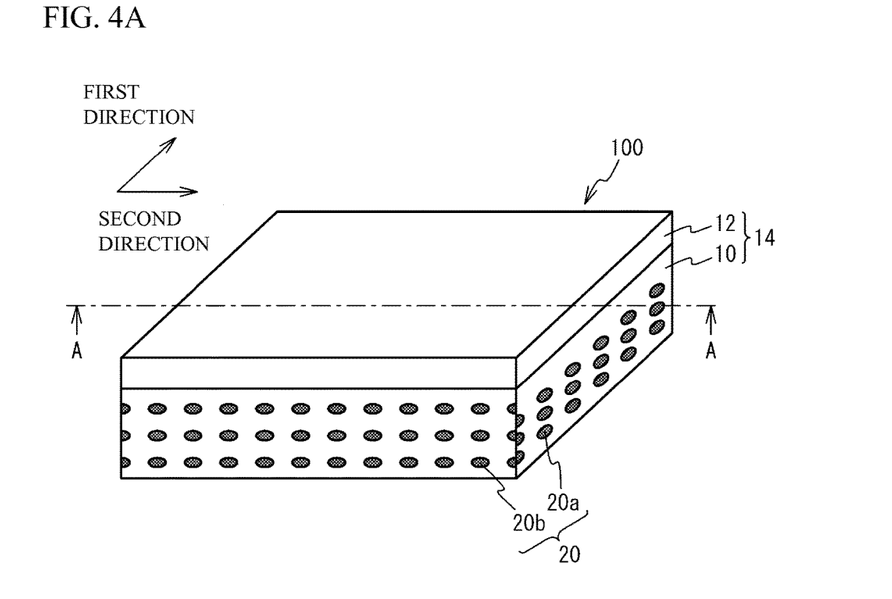
FIG. 4A is a perspective view illustrating the acoustic wave device according to the first embodiment.
Figure 4B:
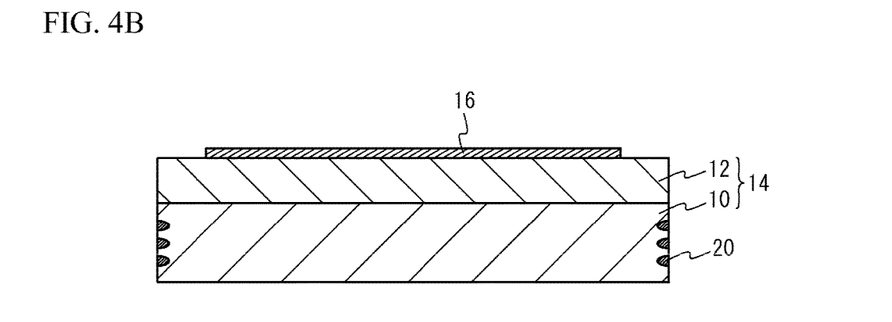
FIG. 4B is a cross-sectional view of the acoustic wave device taken along a line A-A in FIG. 4A.

FIG. 4A is a perspective view illustrating the acoustic wave device according to the first embodiment. FIG. 4B is a cross-sectional view of the acoustic wave device taken along a line A-A in FIG. 4A. Here, in FIG. 4A, the illustration of the IDTs 16 is omitted for the simplification of the drawing. In an acoustic wave device chip 100, by irradiating side surfaces along the first and the second directions of the bonded substrate 14 with the laser beam 36, the reforming regions 20 are formed on the side surfaces as illustrated in FIGS. 4A and 4B. The reforming regions 20a formed on the side surface along the first direction of the bonded substrate 14 and the reforming regions 20b formed on the side surface along the second direction of the bonded substrate 14 are formed at different heights in the thickness direction of the bonded substrate 14. The reforming regions 20a formed on the surface along the first direction are formed away from the upper surface and the lower surface of the bonded substrate 14, compared with the reforming regions 20b formed on the surface along the second direction, for example.

Figure 5A:
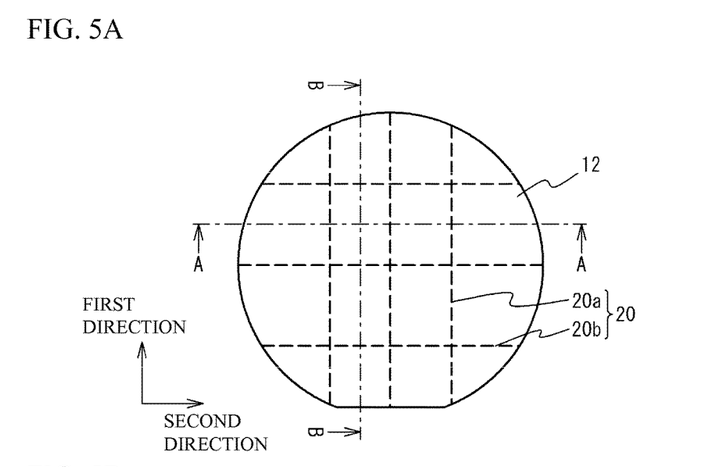
FIG. 5A is a top view of a wafer right after reforming regions are formed in a comparative example 1.
Figure 5B:
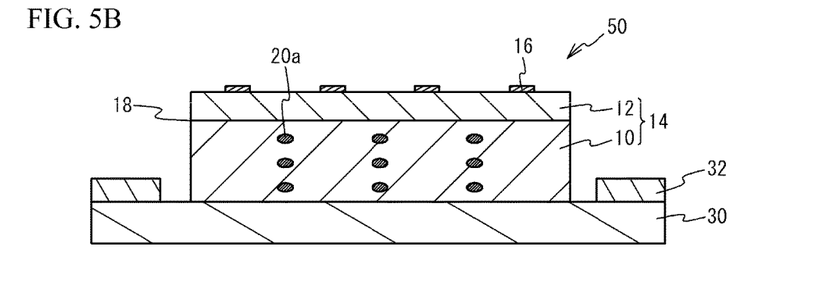
FIG. 5B is a cross-sectional view of the wafer taken along a line A-A in FIG. 5A.
Figure 5C:
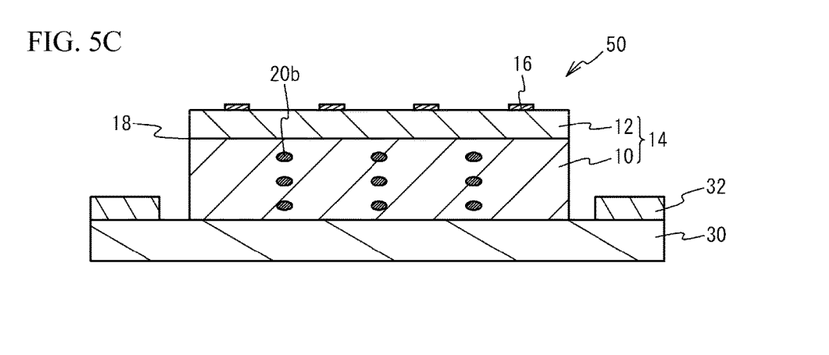
FIG. 5C is a cross-sectional view of the wafer taken along a line B-B in FIG. 5A.

Next, a description will be given of the acoustic wave device of a comparative example 1 which is a comparison target, to explain an effect of the acoustic wave device of the first embodiment. FIG. 5A is a top view of the wafer right after the reforming regions are formed in the comparative example 1. FIG. 5B is a cross-sectional view of the wafer taken along a line A-A in FIG. 5A. FIG. 5C is a cross-sectional view of the wafer taken along a line B-B in FIG. 5A. Also in the comparative example 1, the reforming regions 20 are formed in the supporting substrate 10, as with the first embodiment, as illustrated in FIG. 5A to 5C. At this time, unlike the first embodiment, the laser beam 36 is emitted without changing the conditions of the first direction and the second direction. Therefore, the reforming regions 20a to be formed along the first direction and the reforming regions 20b to be formed along the second direction are formed at the same heights in the thickness direction of the bonded substrate 14. Then, the wafer 50 are divided in the same manner as FIGS. 2A and 2B of the first embodiment.

Here, a description will be given of experiments that an inventor has performed. The inventor has examined the occurrence status of chipping and a crack after the wafer 50 is cut and the chips 52 are formed. In the experiments of the first embodiment and the comparative example 1, the bonded substrate 14 is used. In the bonded substrate 14, the supporting substrate 10 which is a sapphire substrate having a thickness of 110 μm and the piezoelectric substrate 12 which is a 42° rotated Y-axis cut X-direction propagation LT substrate having a thickness of 40 μm are bonded with each other. Moreover, three reforming regions 20 are formed in the thickness direction of the bonded substrate 14. It is assumed that the three reforming regions 20 are called first reforming regions, second reforming regions and third reforming regions sequentially from a position near the piezoelectric substrate 12. Also, the wafer 50 is broken in the second direction so as to be the plurality of strip-shaped wafers, and the strip-shaped wafers are broken in the first direction and divided as the chips 52. A length of a side surface along the first direction of the divided chips 52 is 0.75 mm, and a length of a side surface along the second direction thereof is 1.0 mm. Here, the first direction is an X-axis direction of the crystal orientation of the 42° rotated Y-axis cut X-direction propagation LT substrate, and the second direction is a direction orthogonal to the X-axis direction.

Formation conditions and formation positions of the reforming regions according to the first embodiment and the comparative example 1 (sample 1 and sample 2) are illustrated in tables 1 to 3.

TABLE 1

| | | FIRST EMBODIMENT | | | |
|---|---|---|---|---|---|
| | | MOVING VELOCITY (mm/sec) | OUTPUT POWER (W) | DEPTH (μm) | INTERVAL (mm) |
| FIRST DIRECTION | FIRST REFORMING REGION | 180 | 0.1 | 90 | 3.6 |
| | SECOND REFORMING REGION | 360 | 0.14 | 105 | 7.2 |
| | THIRD REFORMING REGION | 360 | 0.16 | 120 | 7.2 |
| SECOND DIRECTION | FIRST REFORMING REGION | 180 | 0.1 | 70 | 3.6 |
| | SECOND REFORMING REGION | 360 | 0.14 | 100 | 7.2 |
| | THIRD REFORMING REGION | 360 | 0.16 | 130 | 7.2 |

As illustrated in the table 1, in the first embodiment, the first reforming regions are formed by moving the laser beam at 180 mm/sec in the first direction (i.e., the X-axis direction) and irradiating the bonded substrate 14 with the laser beam having the output power of 0.1 W (watt). The second reforming regions are formed by moving the laser beam at 360 mm/sec and irradiating positions deeper than the first reforming regions with the laser beam having the output power of 0.14 W (watt). The third reforming regions are formed by moving the laser beam at 360 mm/sec and irradiating positions deeper than the second reforming regions with the laser beam having the output power of 0.16 W (watt). Here, the irradiation frequency of the laser beam is 50 Hz. Thereby, the first reforming regions are formed so that a depth from the upper surface of the piezoelectric substrate 12 is 90 μm and an interval between the first reforming regions is 3.6 mm. The second reforming regions are formed so that the depth from the upper surface of the piezoelectric substrate 12 is 105 μm and an interval between the second reforming regions is 7.2 mm. The third reforming regions are formed so that the depth from the upper surface of the piezoelectric substrate 12 is 120 μm and an interval between the third reforming regions is 7.2 mm.

Also in the second direction (i.e., the direction orthogonal to the X-axis direction), the first to the third reforming regions are formed by moving the laser beam at the same moving velocity as the moving velocity of the first direction and irradiating the bonded substrate 14 with the laser beam having the same output power as the output power of the first direction. However, the focal position of the laser beam in the second direction differs from that of the laser beam in the first direction. Therefore, in the second direction, the first reforming regions are formed in the depth of 70 μm from the upper surface of the piezoelectric substrate 12, the second reforming regions are formed in the depth of 100 μm from the upper surface of the piezoelectric substrate 12, and the third reforming regions are formed in the depth of 130 μm from the upper surface of the piezoelectric substrate 12.

Therefore, the reforming regions formed along the first direction are formed away from the upper surface and the lower surface of the bonded substrate 14, compared with the reforming regions formed along the second direction. Moreover, intervals between the first reforming regions and the third reforming regions located at both ends in the thickness direction of the bonded substrate 14, among the reforming regions formed along the second direction, become wider than intervals between the first reforming regions and the third reforming regions among the reforming regions formed along the first direction.

TABLE 2

| | | SAMPLE 1 OF COMPARATIVE EXAMPLE | | | |
|---|---|---|---|---|---|
| | | MOVING VELOCITY (mm/sec) | OUTPUT POWER (W) | DEPTH (μm) | INTERVAL (mm) |
| FIRST DIRECTION | FIRST REFORMING REGION | 180 | 0.1 | 70 | 3.6 |
| | SECOND REFORMING REGION | 360 | 0.14 | 100 | 7.2 |
| | THIRD REFORMING REGION | 360 | 0.16 | 130 | 7.2 |
| SECOND DIRECTION | FIRST REFORMING REGION | 180 | 0.1 | 70 | 3.6 |
| | SECOND REFORMING REGION | 360 | 0.14 | 100 | 7.2 |
| | THIRD REFORMING REGION | 360 | 0.16 | 130 | 7.2 |

In the sample 1 of the comparative example 1, the first to the third reforming regions are formed by moving the laser beam at the same moving velocity as the moving velocity of the first embodiment and irradiating the bonded substrate 14 with the laser beam having the same output power as the output power of the first embodiment. However, unlike the first embodiment, the focal position of the laser beam in the first direction and the focal position of the laser beam in the second direction are made the same. Therefore, in the first and the second directions, the first reforming regions are formed in the depth of 70 μm from the upper surface of the piezoelectric substrate 12, the second reforming regions are formed in the depth of 100 μm from the upper surface of the piezoelectric substrate 12, and the third reforming regions are formed in the depth of 130 μm from the upper surface of the piezoelectric substrate 12.

TABLE 3

| | | SAMPLE 2 OF COMPARATIVE EXAMPLE | | |
|---|---|---|---|---|
| | | MOVING VELOCITY (mm/sec) | OUTPUT POWER (W) | DEPTH (μm) | INTERVAL (mm) |
| FIRST DIRECTION | FIRST REFORMING REGION | 180 | 0.1 | 90 | 3.6 |
| | SECOND REFORMING REGION | 360 | 0.14 | 105 | 7.2 |
| | THIRD REFORMING REGION | 360 | 0.16 | 120 | 7.2 |
| SECOND DIRECTION | FIRST REFORMING REGION | 180 | 0.1 | 90 | 3.6 |
| | SECOND REFORMING REGION | 360 | 0.14 | 105 | 7.2 |
| | THIRD REFORMING REGION | 360 | 0.16 | 120 | 7.2 |

In the sample 2 of the comparative example 1, the focal position of the laser beam in the first direction and the focal position of the laser beam in the second direction are made the same, as with the sample 1 of the comparative example 1, but the focal positions of the laser beam in the first and the second directions are made different from corresponding focal positions in the sample 1 of the comparative example 1. Therefore, in the first and the second directions, the first reforming regions are formed in the depth of 90 μm from the upper surface of the piezoelectric substrate 12, the second reforming regions are formed in the depth of 105 μm from the upper surface of the piezoelectric substrate 12, and the third reforming regions are formed in the depth of 120 μm from the upper surface of the piezoelectric substrate 12.

An occurrence rate of crack and an occurrence rate of chipping according to the first embodiment and the samples 1 and 2 of the comparative example 1 are as follows. Here, the occurrence rate of crack indicates a rate of chips generating the crack to 7000 produced chips, and the occurrence rate of chipping indicates a rate of chips generating the chipping to the 7000 produced chips.

Sample 1 of comparative example 1: the occurrence rate of chipping is 0.1%, and the occurrence rate of crack is 8%;

Sample 2 of comparative example 1: the occurrence rate of chipping is 3%, and the occurrence rate of crack is 0.1%; and First embodiment: the occurrence rate of chipping is 0.2%, and the occurrence rate of crack is 0.1%.

Figure 6:
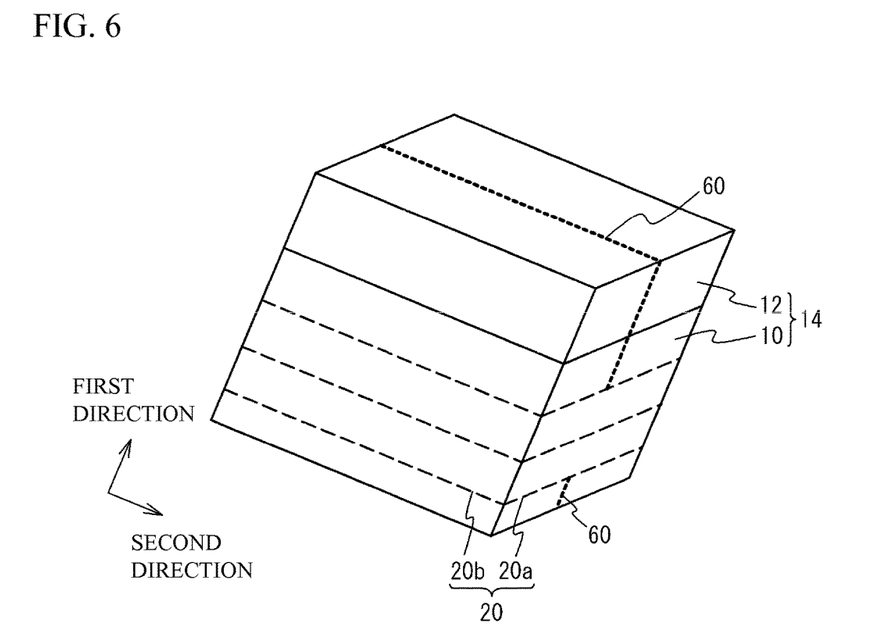
FIG. 6 is a perspective view of a chip for explaining a crack.

In the sample 1 of the comparative example 1, the occurrence rate of chipping is low but the occurrence rate of crack is high. FIG. 6 is a perspective view of the chip for explaining the crack. As illustrated in FIG. 6, a crack 60 occurs in the chip so as to extend from a side surface of the chip along the first direction (i.e., the X-axis direction) toward the second direction (i.e., the direction orthogonal to the X-axis direction). In the LT substrate, the linear expansion coefficient of the X-axis direction is larger than that of the direction orthogonal to the X-axis direction, and hence a stress by a distortion is applied to the side surface along the X-axis direction (i.e., the first direction). It is considered that the crack starting from the first reforming regions and the third reforming regions occurs according to the stress by the distortion since the first reforming regions and the third reforming regions are provided near the upper surface and the lower surface of the bonded substrate 14, respectively. From this, it can be said that it is desirable that the reforming regions are provided near a center in the thickness direction of the bonded substrate 14 and away from the upper surface and the lower surface of the bonded substrate 14 in order to suppress the occurrence of the crack. Here, such a stress by the distortion occurs not only when the linear expansion coefficient of the first direction is larger than that of the second direction but also when the linear expansion coefficients are different in the first direction and the second direction. It is considered that the crack occurs in these case.

Figure 7:
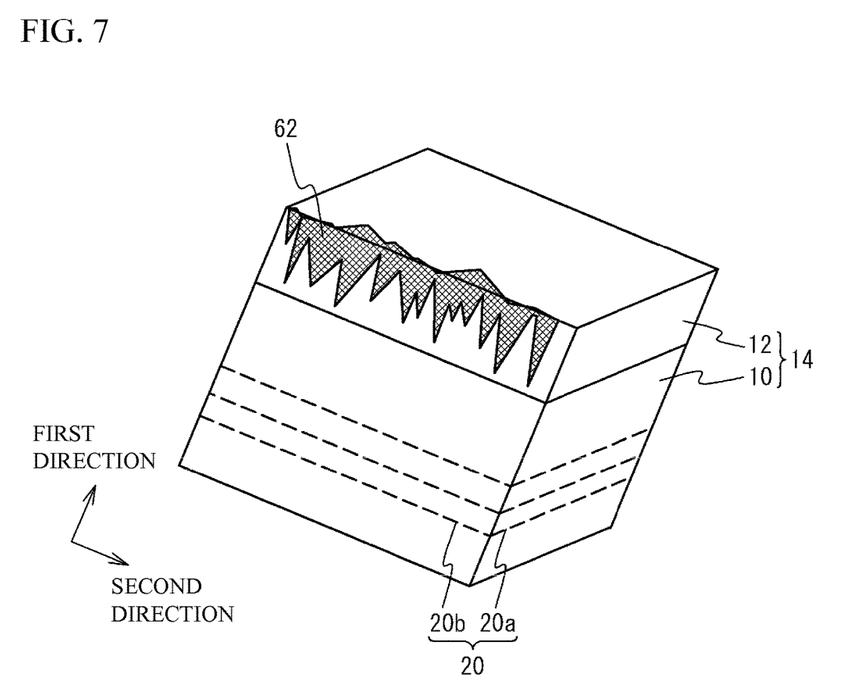
FIG. 7 is a perspective view of a chip for explaining chipping.

In the sample 2 of the comparative example 1, since the first to the third reforming regions are provided away from the upper surface and the lower surface of the bonded substrate 14, the occurrence rate of crack is low. However, the occurrence rate of chipping is high. FIG. 7 is a perspective view of the chip for explaining the chipping. As illustrated in FIG. 7, chipping 62 occurs in the side surface of the chip along the second direction. It is considered that a division characteristic deteriorates and the chipping 62 occurs since the first to the third reforming regions are provided near the center in the thickness direction of the bonded substrate 14 and away from the upper surface and the lower surface of the bonded substrate 14. Moreover, it is considered that the reason why the chipping 62 does not occur in the side surface along the first direction is because the wafer is broken in the second direction so as to be the plurality of strip-shaped wafers and then the strip-shaped wafers are broken along the first direction. From this, it can be said that it is desirable that the reforming regions are provided widely in the thickness direction of the bonded substrate 14 in order to suppress the occurrence of the chipping.

Therefore, in the first embodiment, by irradiating the bonded substrate 14 with the laser beam under different conditions in the first direction and the second direction, the first to the third reforming regions to be formed along the first direction are provided away from the upper surface and the lower surface of the bonded substrate 14. The first to the third reforming regions to be formed along the second direction are formed widely in the thickness direction of the bonded substrate 14. Thereby, the occurrence rate of chipping and the occurrence rate of crack become low.

According to the first embodiment, by irradiating the bonded substrate 14 with the laser beam 36 under different conditions in the first direction and the second direction, reforming regions 20 are formed in the bonded substrate 14 including the piezoelectric substrate 12 in which the linear expansion coefficients are different in the first direction and the second direction. As illustrated in FIGS. 3A to 3C, the reforming regions 20a to be formed along the first direction and the reforming regions 20b to be formed along the second direction are formed at different heights in a thickness direction of the bonded substrate 14, for example. Then, in the reforming regions 20, the bonded substrate 14 is cut in the first and the second directions. Thereby, it is possible to suppress the occurrence of the chipping and the crack.

Here, the first embodiment is not limited to a case where the reforming regions are formed at different heights in the first direction and the second direction. For example, the number of reforming regions in the thickness direction of the bonded substrate may be made different in the first direction and the second direction. For example, the sizes of the reforming regions may be made different in the first direction and the second direction. For example, intervals between adjacent reforming regions in a parallel direction to the upper surface of the bonded substrate may be made different in the first direction and the second direction.

When the linear expansion coefficient of the first direction of the piezoelectric substrate 12 is larger than that of the second direction thereof as illustrated in FIG. 6, the crack extending toward the second direction from the side surface along the first direction occurs. In order to suppress the occurrence of the crack, it is desirable that the reforming regions 20a to be formed along the first direction are formed away from the upper surface and the lower surface of the bonded substrate 14 as illustrated in FIGS. 3A to 3C, compared with the reforming regions 20b to be formed along the second direction.

As illustrated in FIG. 7, the chipping 62 occurs when the wafer 50 is cut in the strip-shaped wafers. It is effective that the reforming regions 20 in the cut surfaces of the wafer 50 are formed widely in the thickness direction of the bonded substrate 14 in order to suppress the chipping 62. When the wafer 50 is cut along the first direction having a large linear expansion coefficient to form the strip-shaped wafers, for example, it is desirable that the reforming regions 20a to be formed along the first direction are formed widely in the thickness direction of the bonded substrate 14 in order to suppress the chipping 62. However, in this case, the crack 60 occurs on the side surface along the first direction. On the other hand, since the crack 60 is hard to occur from the side surface along the second direction having a small linear expansion coefficient, the reforming regions 20b to be formed along the second direction can be formed widely in the thickness direction of the bonded substrate 14. For this reason, when the linear expansion coefficient of the first direction is larger than that of the second direction, it is desirable that the intervals between the reforming regions 20b located at both ends in the thickness direction of the bonded substrate 14, among the reforming regions 20b to be formed along the second direction, are formed wider than the intervals between the reforming regions 20a located at both ends in the thickness direction of the bonded substrate 14 among the reforming regions 20a to be formed along the first direction. Moreover, it is desirable that the wafer 50 is broken in the second direction so as to be the plurality of strip-shaped wafers and then the strip-shaped wafers are broken in the first direction and divided as the chips.

When the bonded substrate 14 is broken by pressing the blade 38 to the bonded substrate 14, as illustrated in FIG. 2A, the chipping and the crack occur easily. Therefore, in this case, it is effective to form the reforming regions 20 by irradiating the bonded substrate 14 with the laser beam 36 under different conditions in the first direction and the second direction. Moreover, even when the substrate is broken using other method, there is a possibility that the chipping and the crack occur. Therefore, it is desirable to form the reforming regions 20 by irradiating the bonded substrate 14 with the laser beam 36 under different conditions in the first direction and the second direction even when other method is used.

When the supporting substrate 10 is harder than the piezoelectric substrate 12, the chipping and the crack easily occur in the piezoelectric substrate 12. When the supporting substrate 10 is a sapphire substrate, a spinel substrate or a silicon substrate, for example, the chipping and the crack easily occur in the piezoelectric substrate 12. Therefore, in this case, it is effective to form the reforming regions 20 by irradiating the bonded substrate 14 with the laser beam 36 under different conditions in the first direction and the second direction.

The first embodiment explains an example of a case where the piezoelectric substrate 12 is the rotated Y-axis cut X-direction propagation LT substrate, the first direction is the X-axis direction of the crystal orientation of the LT substrate, and the second direction is the direction orthogonal to the X-axis direction. However, since the crack occurs easily when the linear expansion coefficients of the piezoelectric substrate 12 are different in the first direction and the second direction, the piezoelectric substrate 12 needs to be a substrate in which the linear expansion coefficients are different in the first direction and the second direction. For example, the piezoelectric substrate 12 may be a rotated Y-axis cut X-direction propagation lithium niobate (LN) substrate, and the first direction may be the X-axis direction of the crystal orientation of the LN substrate. Moreover, the first embodiment explains an example of a case where the bonded substrate 14 in which the lower surface of the piezoelectric substrate 12 is bonded on the upper surface of the supporting substrate 10 is used, but a single substrate of the piezoelectric substrate 12 may be used. In this case, needless to say, the reforming regions 20 are formed in the piezoelectric substrate 12.

For example, an acoustic surface wave device, an acoustic boundary wave device, a love wave device or the like can be used as the acoustic wave device.

Although the embodiments of the present invention have been described in detail, the present invention is not limited to these specific embodiments, and the various changes, substitutions, and alterations could be made hereto without departing from the spirit and scope of the invention.

What is claimed is:

1. A method for manufacturing an acoustic wave device comprising:

forming a plurality of first reforming regions in a substrate along a first direction and a plurality of second reforming regions in the substrate along a second direction intersecting the first direction by irradiating the substrate with a laser beam under different conditions in the first direction and the second direction, the substrate including a piezoelectric substrate on which an Inter-Digital Transducer (IDT) is formed, a linear expansion coefficient in the first direction of the piezoelectric substrate being larger than a linear expansion coefficient in the second direction, the plurality of first reforming regions including a plurality of reforming regions to be formed in a thickness direction of the substrate, and the plurality of second reforming regions including a plurality of reforming regions to be formed in the thickness direction of the substrate; and cutting the substrate in the first direction and the second direction at the plurality of first and second reforming regions, respectively, wherein the forming the plurality of first reforming regions and the plurality of second reforming regions includes forming the plurality of first reforming regions and the plurality of second reforming regions so that a first upper reforming region located closest to an upper surface of the substrate among the plurality of reforming regions included in the plurality of first reforming regions is located away from the upper surface of the substrate than a second upper reforming region located closest to the upper surface of the substrate among the plurality of reforming regions included in the plurality of second reforming regions, a first lower reforming region located closest to a lower surface of the substrate among the plurality of reforming regions included in the plurality of first reforming regions is located away from the lower surface of the substrate than a second lower reforming region located closest to the lower surface of the substrate among the plurality of reforming regions included in the plurality of second reforming regions, and an interval between the second upper reforming region and the second lower reforming region is wider than an interval between the first upper reforming region and the first lower reforming region.

2. The method for manufacturing the acoustic wave device as claimed in claim 1, wherein
the cutting the substrate includes cutting the substrate in the first direction after cutting the substrate in the second direction.

3. The method for manufacturing the acoustic wave device as claimed in claim 1, wherein
the cutting the substrate includes breaking the substrate by pressing a blade to the substrate.

4. The method for manufacturing the acoustic wave device as claimed in claim 1, wherein
the piezoelectric substrate is a rotated Y-axis cut X-direction propagation lithium tantalite substrate or a rotated Y-axis cut X-direction propagation lithium niobate substrate, and
the first direction is an X-axis direction of a crystal orientation of the lithium tantalite substrate or the lithium niobate substrate.

5. The method for manufacturing the acoustic wave device as claimed in claim 1, wherein
the substrate is a single substrate of the piezoelectric substrate, or a bonded substrate in which a lower surface of the piezoelectric substrate is bonded on an upper surface of a supporting substrate.

6. The method for manufacturing the acoustic wave device as claimed in claim 5, wherein
the supporting substrate is a sapphire substrate, a spinel substrate or a silicon substrate.

7. The method for manufacturing the acoustic wave device as claimed in claim 1, wherein
the substrate is a bonded substrate in which a lower surface of the piezoelectric substrate is bonded on an upper surface of a supporting substrate, and
the forming the plurality of first reforming regions and the plurality of second reforming regions includes forming the plurality of first reforming regions and the plurality of second reforming regions only in the supporting substrate among the piezoelectric substrate and the supporting substrate.

8. The method for manufacturing the acoustic wave device as claimed in claim 7, wherein the forming the plurality of first reforming regions and the plurality of second reforming regions includes forming the plurality of first reforming regions and the plurality of second reforming regions so that the first upper reforming region is located away from an upper surface of the supporting substrate than the second upper reforming region, and the first lower reforming region is located away from a lower surface of the supporting substrate than the second lower reforming region.

9. A method for manufacturing an acoustic wave device comprising:
forming a plurality of first reforming regions in a substrate along a first direction and a plurality of second reforming regions in the substrate along a second direction intersecting the first direction by irradiating the substrate with a laser beam under different conditions in the first direction and the second direction, the substrate including a piezoelectric substrate on which an Inter-Digital Transducer (IDT) is formed, a linear expansion coefficient in the first direction of the piezoelectric substrate being larger than a linear expansion coefficient in the second direction, the plurality of first reforming regions including a plurality of reforming regions to be formed in a thickness direction of the substrate, and the plurality of second reforming regions including a plurality of reforming regions to be formed in the thickness direction of the substrate; and
cutting the substrate in the first direction and the second direction at the plurality of first and second reforming regions, respectively,
wherein the forming the plurality of first reforming regions and the plurality of second reforming regions includes forming the plurality of first reforming regions and the plurality of second reforming regions so that a first upper reforming region located closest to an upper surface of the substrate among the plurality of reforming regions included in the plurality of first reforming regions is located away from the upper surface of the substrate than a second upper reforming region located closest to the upper surface of the substrate among the plurality of reforming regions included in the plurality of second reforming regions, a first lower reforming region located closest to a lower surface of the substrate among the plurality of reforming regions included in the plurality of first reforming regions is located away from the lower surface of the substrate than a second lower reforming region located closest to the lower surface of the substrate among the plurality of reforming regions included in the plurality of second reforming regions, and the first upper reforming region and the second upper reforming region are located at different heights in a thickness direction of the substrate.

10. A method for manufacturing an acoustic wave device comprising:
forming a plurality of first reforming regions in a substrate along a first direction and a plurality of second reforming regions in the substrate along a second direction intersecting the first direction by irradiating the substrate with a laser beam under different conditions in the first direction and the second direction, the substrate including a piezoelectric substrate on which an Inter-Digital Transducer (IDT) is formed, a linear expansion coefficient in the first direction of the piezoelectric substrate being larger than a linear expansion coefficient in the second direction, the plurality of first reforming regions including a plurality of reforming regions to be formed in a thickness direction of the substrate, and the plurality of second reforming regions including a plurality of reforming regions to be formed in the thickness direction of the substrate; and cutting the substrate in the first direction and the second direction at the plurality of first and second reforming regions, respectively, wherein the forming the plurality of first reforming regions and the plurality of second reforming regions includes forming the plurality of first reforming regions and the plurality of second reforming regions so that a first upper reforming region located closest to an upper surface of the substrate among the plurality of reforming regions included in the plurality of first reforming regions is located away from the upper surface of the substrate than a second upper reforming region located closest to the upper surface of the substrate among the plurality of reforming regions included in the plurality of second reforming regions, a first lower reforming region located closest to a lower surface of the substrate among the plurality of reforming regions included in the plurality of first reforming regions is located away from the lower surface of the substrate than a second lower reforming region located closest to the lower surface of the substrate among the plurality of reforming regions included in the plurality of second reforming regions, and the first lower reforming region and the second lower reforming region are located at different heights in a thickness direction of the substrate.

* * * * *